United States Patent [19]

Faulkner et al.

[11] Patent Number: 4,541,065
[45] Date of Patent: Sep. 10, 1985

[54] DIRECT VOLTS CALIBRATOR

[75] Inventors: Neil P. Faulkner; Walter W. Prue, Jr., both of Seattle, Wash.

[73] Assignee: John Fluke Mfg. Co., Inc., Everett, Wash.

[21] Appl. No.: 418,161

[22] Filed: Sep. 14, 1982

[51] Int. Cl.³ ............................................. G01C 25/00
[52] U.S. Cl. .................... 364/571; 364/483; 324/99 D
[58] Field of Search .............................. 364/483, 571; 340/347 CC, 870.04; 73/1 R, 3, 5; 324/130, 83 Q, 99 D

[56] References Cited

U.S. PATENT DOCUMENTS

| | | | |
|---|---|---|---|
| 3,510,770 | 7/1967 | Lowe | 340/347 CC |
| 3,633,202 | 1/1972 | Kuckein et al. | 324/130 |
| 3,665,305 | 5/1972 | Petrohilos | 324/130 |
| 3,764,983 | 10/1973 | Stok | 340/870.04 |
| 4,099,240 | 7/1978 | Rode et al. | 340/870.04 |
| 4,127,811 | 11/1978 | Gookin, Jr. et al. | 324/130 |
| 4,130,796 | 12/1978 | Shum | 73/1 R |
| 4,222,107 | 9/1980 | Mrozowski et al. | 340/347 CC |
| 4,263,803 | 4/1981 | Burkhardt | 73/1 R |

OTHER PUBLICATIONS

Marthinsson, Bo, IEEE Transactions on Instrumentation and Measurement, vol. IM-22, No. 4, Dec. 1973, pp. 343-347.

Primary Examiner—Errol A. Krass
Assistant Examiner—Heather R. Herndon
Attorney, Agent, or Firm—Mikio Ishimaru; Stephen A. Becker

[57] ABSTRACT

A stable voltage reference is connected to a two channel digital to analog converter connected to a range setting amplifier which provides the calibrator output. A microprocessor zeroes the calibrator by shorting the inputs of a zero amplifier to provide a reference zero towards which the calibrator is adjusted. It establishes the relative weighing of the two channels by adjusting one channel one increment up from zero and measuring the number of increments required by the other channel to return to zero. The microprocessor determines the gain change in the converter by establishing a bridge with known components and relating changes in the bridge voltage to the shift in gain.

10 Claims, 5 Drawing Figures

DIRECT VOLTS CALIBRATOR

BACKGROUND OF THE INVENTION

In the past, direct volts calibrators were very complex instruments which required highly trained operators. To obtain highest accuracy for use on a daily basis required extremely difficult and time consuming calibration procedures. Often, the instrument had to be partially disassembled in order to reach the zero setting potentiometers and a great deal of skill was required in zeroing the instrument.

Further, it was very difficult to obtain setting accuracy to within half a microvolt and it was very time consuming to keep track of the instrument's performance so that problems could be located before a catastrophic failure occurred.

SUMMARY OF THE INVENTION

The present invention provides a closed loop procedure to automatically zero and compensate for gain errors, which requires no external equipment or operator intervention.

The present invention further provides a means for circuitry and components to achieve combined accuracies better than their individual limitations.

The present invention further provides an arrangement for changing the internal reference connection so as to eliminate the effect of internal offset voltages.

The present invention further provides a simple and accurate method of determining the gain shift of components in a direct volts calibration.

The present invention further provides a procedure to automatically reduce linearity errors within a digital to analog converter.

The present invention provides a method for measuring the gain shift to within 0.2 of a part per million with high repeatability.

A direct volts calibrator in accordance with the apparatus and method of the invention comprises a highly stable reference potential source, a controlled characteristic digital to analog converter, preferably of a pulse width modulated type, connected to the output of the reference source and a selectable gain power amplifier driven by the output of the converter. The gain of the power amplifier is controlled by a plurality of feedback resistors selectively connected across it. The reference source, converter and power amplifier are controlled by a microprocessor to develop a variable magnitude direct volts output having a resolution that is dependent upon the resolution of the converter.

In accordance with one aspect of the invention, the digital to analog converter is controlled by an adjusted signal that is developed by a zero amplifier having a pair of inputs that are connected selectively to each other or to the output of the power amplifier. The output of the zero amplifier is first measured with its input terminals connected together, to obtain a first output measurement that corresponds to the offset voltage of the zero amplifier (assuming a unity gain amplifier). The input terminals of the zero amplifier are then connected to the output of the power amplifier, and with the converter controlled by the microprocessor to have a zero output from the power amplifier, a second measurement at the output of the zero amplifier is obtained. The difference between the first and second output measurements, corresponding to the zero offset of the converter and power amplifier, is obtained to provide an offset correction signal to be applied to a control input of the converter.

Preferably, measurements of the output of the zero amplifier are made by an analog to digital converter within the direct volts calibrator.

In accordance with a second aspect of the apparatus and method of the invention, the input control signal of the digital to analog converter is further corrected to compensate for variations in the composite gain of an output amplifier within the converter and power amplifier caused by drift, variations in the feedback resistor ratio and other factors. During a gain shift correction cycle, the feedback resistance for each range of the power and the inverting input of the inverting amplifier through its input resistance are connected to the fixed reference potential. The power amplifier is connected to other resistors to make up a high gain amplifier. A first measurement of the output of the power amplifier is made. The polarity of the fixed reference is then reversed, and a second output measurement of the power amplifier is made. Any difference measured between the two output measurements corresponds to the change in composite gain of the converter amplifier and power amplifier due only to a change in gain resistance ratio of the amplifier, independent of changes in the fixed reference potential or in amplifier offsets.

Still other objects and advantages of the present invention will become readily apparent to those skilled in this art from the following detailed description, wherein we have shown and described only the preferred embodiment of the invention, simply by way of illustration of the best mode contemplated by us of carrying out our invention. As will be realized, the invention is capable of other and different embodiments, and its several details are capable of modifications in various obvious respects, all without departing from the invention. Accordingly, the drawings and description are to be regarded as illustrative in nature, and not as restrictive.

DESCRIPTION OF THE PREFERRED EMBODIMENTS

Figure 1:
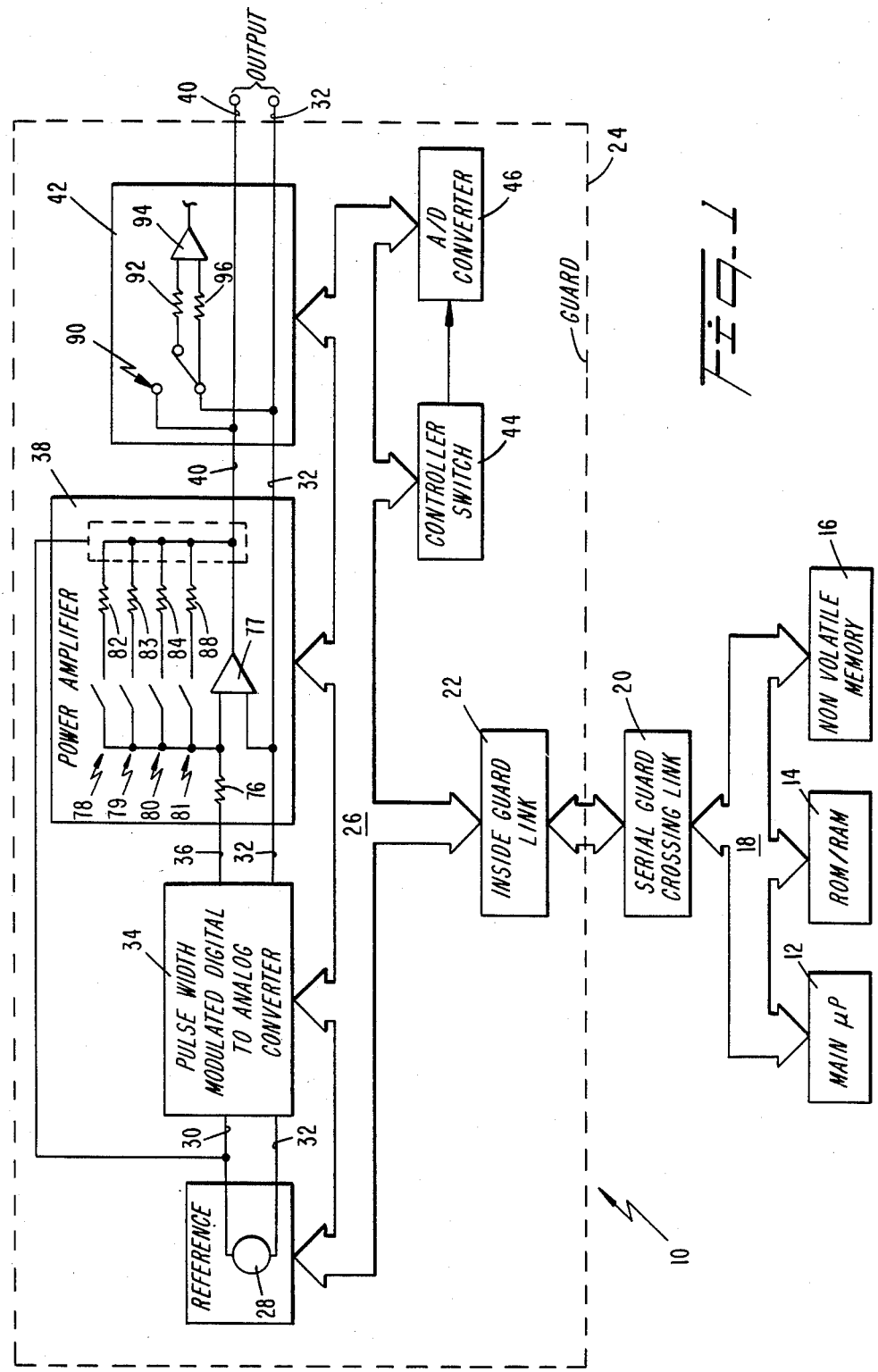
FIG. 1 is a block diagram of a direct volts calibrator incorporating the present invention.

Referring now to FIG. 1, therein as shown a block diagram, partially in schematics, of the direct volts caibrator 10 incorporating the present invention. The direct volts calibrator 10 operates under the control of a main microprocessor 12 which may be any conventional program controlled microprocessor. The main microprocessor 12 is controlled by programming instructions stored in Read Only Memory/Random Access Memory (ROM/RAM) 14. Data from the main microprocessor 12 may be stored in nonvolatile memory 16 which may be a conventional electronically programmable and eraseable memory.

Control signals from the main microprocessor 12 pass over a bus 18 to a serial guard crossing link 20 which is connected to an inside link 22 which spans an isolating guard 24 which isolates the less critical analog components of the direct volts calibrator 10 from the digital components outside the guard.

The inside guard link 22 is connected to a main control bus 26 to which the calibration components are connected.

One of the first components connected to the bus 26 is a highly stable voltage reference 28 which is connected by a signal lead 30 and a reference ground lead 32 to a pulse width modulated digital to analog converter (DAC) 34 which is also connected to the bus 26.

The DAC 34 is further connected by signal lead 36 and reference ground lead 32 to an adjustable power amplifier 38 which is also connected to the bus 26. An output lead 40 and the reference ground lead 32 out of the power amplifier 38 are connected to a zero-amp 42 which is also connected to the bus 26. One of the internal outputs of the zero-amp 42 is connectable by a controlled switch 44 to an analog/digital converter (A/D C) 46. Both the control switch 44 and the A/D C 46 are connected to the bus 26.

Figure 2:
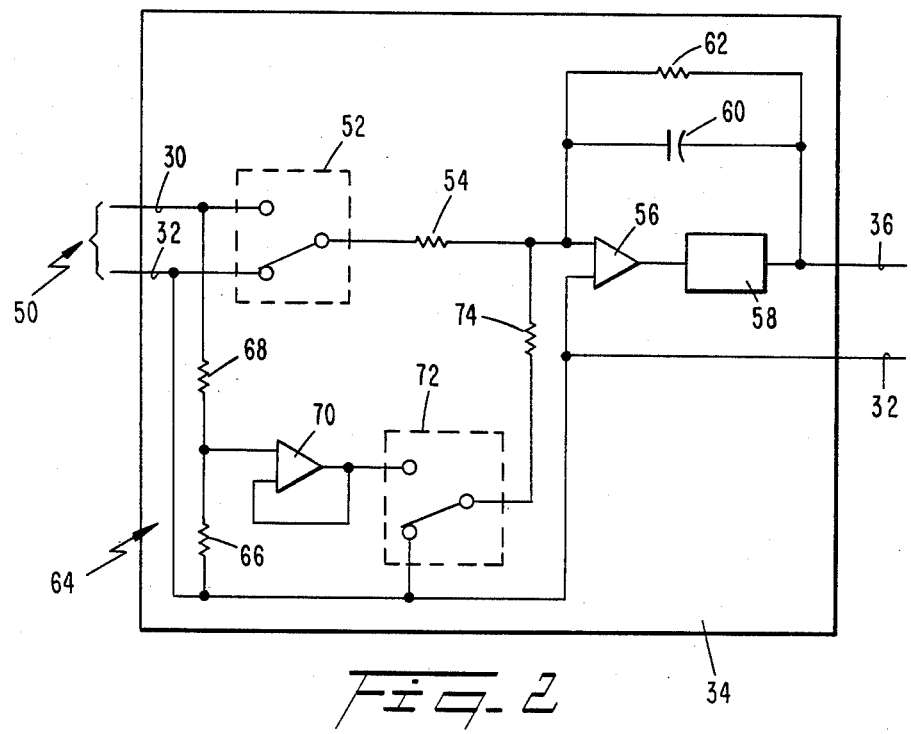
FIG. 2 is a circuit diagram of a two-channel digital to analog converter incorporated within the invention.

Briefly describing the components, it will be mentioned that the precision reference source 28 is of a conventional design well-known to those skilled in the art. Referring to FIG. 2, therein as shown a circuit schematic of the DAC 34 which is a two channel DAC. The first channel 50 includes a microprocessor controlled electronic switch 52 which selectively connects the signal lead 30 or the reference ground lead 32 to a resistor 54. The resistor 54 is connected to the input of an amplifier 56 which has its other input connected to the reference ground lead 32. The output of the amplifier 56 is connected to a low pass filter 58 which is connected to an output lead 36. The amplifier 56 and the low pass filter employ negative feedback through a capacitor 60 and a resistor 62 in parallel.

The second channel 64 includes a resistor 68 which connects signal lead 30 to the junction of resistor 66 and the input of amplifier 70. The other side of resistor 66 connects to reference ground lead 32. The amplifier 70 has its output connected to its own input and to a microprocessor controlled electronic switch 72 which selectively connects the output of the amplifier 70 or the reference ground lead 32. The electronic switch 72 is connected to a resistor 74 which is connected to the input of the amplifier 56.

Referring back to FIG. 1, the DAC 34 is connected to the power amplifier 38 by means of signal lead 36 which in turn connects to a resistor 76 which in turn connects to one input of amplifier 77 and to the microprocessor controlled relay switches 78, 79, 80, and 81. The switches 78 through 81 in turn are connected to resistors 82, 83, 84, and 85 having different values and all commonly connected to the signal lead 40 and the output of amplifier 77.

The zero-amplifier 42 consists of microprocessor controlled relay switch 90 which selectively connects the output lead 40 or the reference ground lead 32 to a resistor 92 which is connected to one input of an amplifier 94 the other input of the amplifier 94 connected by a resistor 96 to the reference ground lead 32.

In operation, the direct volts calibrator 10 operates under the control of the main microprocessor 12. The precision reference voltage 28 puts out a reference voltage of approximately 13 volts to the pulse width modulated DAC 34 which, under microprocessor control, attenuates the voltage on the signal lead 36 to between 0 and 11 volts. This is the way in which the microprocessor controls the final output out of the signal lead 40. The DAC 34 feeds into the power amplifier 38 which has a selectable gain to give different ranges from a 11 volt range to a 1100 volt range. The input to the A/D converter 46 is under the control of the control switch 44 which is switchable to be connected to different points in the direct volts calibrator 10 to take readings as directed by the microprocessor 12. The A/D converter 46 also includes various amplifiers and attenuators which would be obvious to those skilled in the art as required for any particular measurement.

Figure 4:
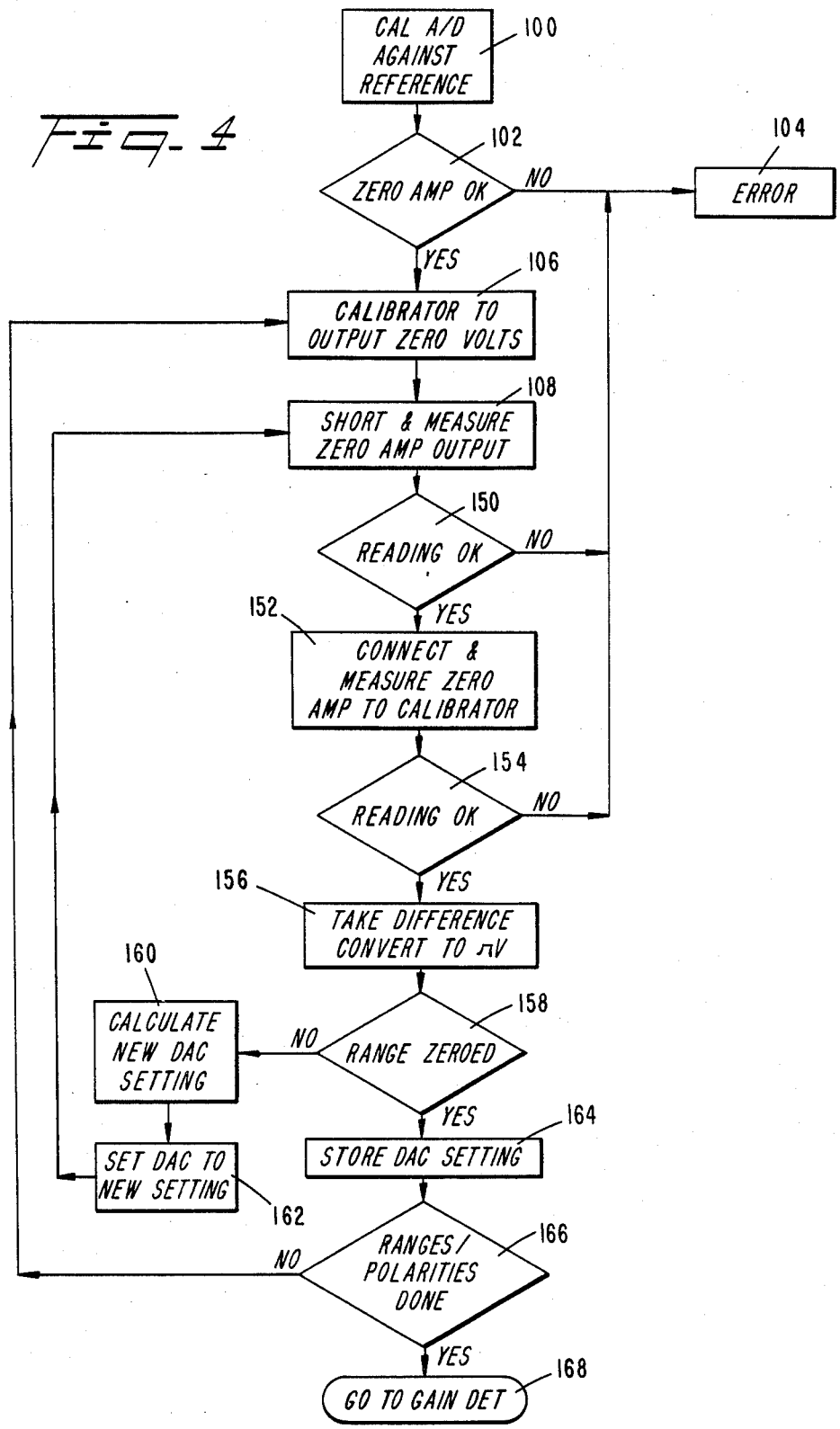
FIG. 4 is a flow chart of the program utilized by the microprocessor used in the direct volts calibrator.

The first step in calibration is to zero, or set equal to the reference ground potential on lead 32, the output of the calibrator 10 for all the voltage ranges. This is done under the control of the program shown in FIG. 4 where the program starts at a cal A/D against reference block 100. The program first goes to decision block 102 to determine if the zero-amplifier 42 is operational, if it is not, an error signal is produced at block 104 detailing the nature of the problem and providing an error message. If the zero-amp is okay, the program proceeds from the decision block 102 to the calibrator to output zero volts block 106 where the calibrator 10 is set up to output zero volts on the first range and polarity being calibrated as set by the switch 81 and the resistor 88. The program then proceeds to short and measure zero-amp block 108.

It is necessary to zero the calibrator 10 to within 1 microvolt so the amplifier 94 of the zero-amp circuit 42, a low noise-high gain amplifier, is switched ahead of the A/D converter 46 by the control switch 44. The A/D full-scale is normally 1 volt. The amplifier 94 has a gain of 1,000, which gives it the equivalent full-scale of 1 millivolt. The relay switch 90 causes the amplifier 94 to be first shorted to the position shown in FIG. 1 and a reading is taken by the microprocessor 12 through the A/D converter 46 which establishes 0 volts at the input to the amplifier 94. The reading is then checked in the decision block 150 and the program provides an appropriate error indication 104 if the reading is too large. Otherwise, the program proceeds to the connect and measure zero-amp to calibrator block 152. This causes the relay switch 90 to connect the amplifier 94 to the output lead 40. A reading is then taken and then checked in the decision block 154, again providing an appropriate error message if the reading is to large in error block 104, or if the reading is acceptable progressing to the take difference and convert to microvolt block 156 where the difference between the shorted and the output readings are determined to discover how far the calibrator output lead 40 is from true 0. The program then checks to see if the range has been zeroed at decision block 158. If the range has not been zeroed, the program will proceed to block 160 where a new DAC setting which will bring the output to 0 volts will be calculated and then will proceed to block 162 to set the DAC to the new setting and then the program will return to block 108. If the range has been zeroed the program will proceed to the store DAC setting block 164 and the program will check at decision block 166 whether all the ranges and polarities have been completed. If they have not, the program will return to block 106 and recycle, otherwise the program will proceed to the gain determination block 168.

Figure 3:
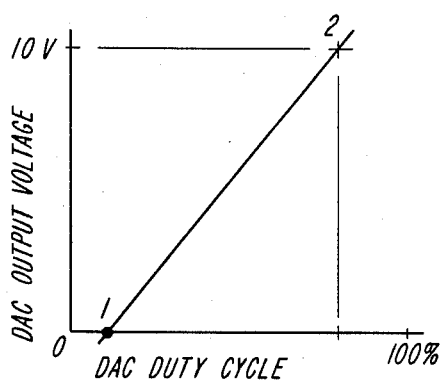
FIG. 3 is a graph of the output of a portion of the direct volts calibrator incorporating the present invention.
Figure 5:
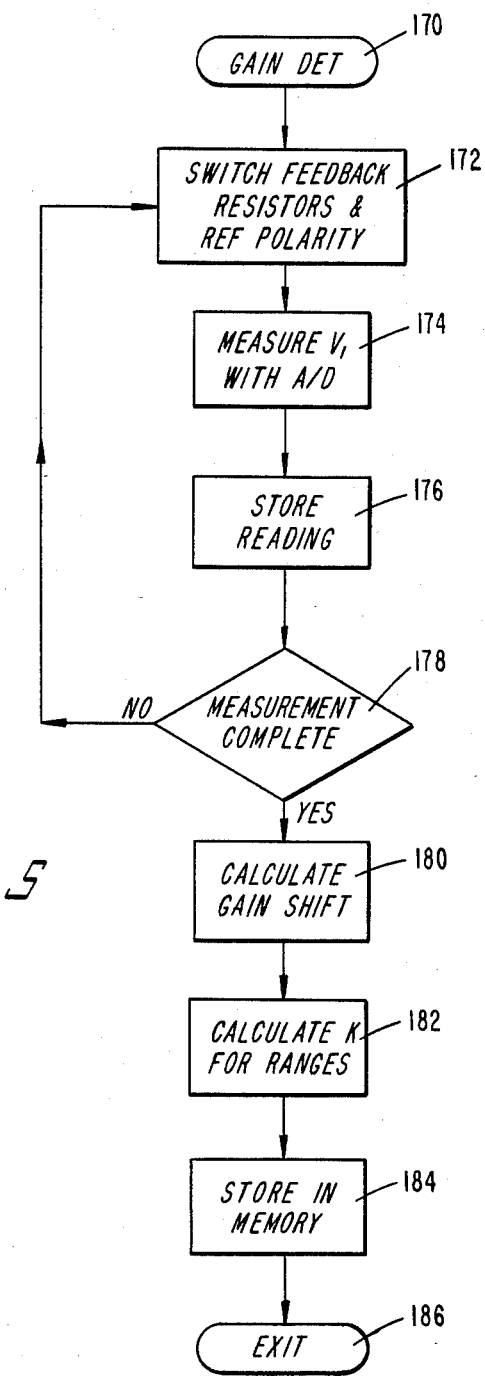
FIG. 5 is a flow chart of an additional portion of the program utilized in the present invention.

Referring now to FIG. 5, the program will start at gain determination block 170. Although it would be evident to those skilled in the art, a brief explanation will be provided here of the operation of the pulse width modulated DAC 34. The electronic switch 52 switches the input of the amplifier 56 between the reference voltage and reference ground at a constant frequency but the microprocessor 12 can change the duty cycle from 0% to 100%. At 0% duty cycle the output of the DAC 34 is 0 and at 100% it would be equal to the reference voltage on the signal lead 30. Referring to FIG. 3, therein as plotted a graph of duty cycle versus output voltage. The DAC 34 is extremely linear and the output voltage can be controlled in very small increments. The second channel 64 operates in substantially the same way but allows greater precision in the digital to analog conversion. As seen in FIG. 3, the output of the DAC may be closely approximated by a straight line all the way from 0 volts to 10 volts. Since there are no potentiometers to calibrate, it is necessary only to find two points on the straight line to be able to evaluate all other points on the line. For convenience, the two points that are chosen are 0 volts out of the DAC 34 and a voltage near the full-scale value. The equation that characterizes the output of the DAC 34 is:

$$v_{out} = v_{ref}(\text{duty cycle}) + v_{(offset)}$$

The voltage $v_{(offset)}$ is the constant offset voltage present in the calibration and explains why in FIG. 3 the straight line doesn't go through the origin of the graph.

The equation that characterizes the output of the calibrator 10 has a similar form and is:

$$v_o = K(\text{DAC duty cycle}) + v_{os}$$

The point 1 on the curve is determined during the zeroing of the calibrator 10. The second point designated by the numeral 2 is found by using a precision external standard voltage which is generally as close as possible to the National Bureau of Standards volt. By adjusting the calibrator 10 output to equal that of the standard volt, it is possible to determine the duty cycle that provided that standard voltage. During the calibration procedure, a different value of K is determined for each range in which the calibrator 10 operates. Also determined are two values for $v_{os}$ for each range, one value for positive output voltage and one for negative output voltage. All of these values are stored in the nonvolatile memory 16 so that the microprocessor 12 may calculate any particular duty cycle necessary to have the calibrator 10 provide a particular desired output voltage.

There is one other constant required by the microprocessor 12 for calibration. As previously mentioned, the first channel 50 switches between the reference ground and the reference voltage while the second channel 64 switches between the reference ground and a divided down voltage from the reference voltage. So the contribution of the second channel is much less than that of the first channel. These two contributions are added together at the input of the amplifier 56 to improve speed and to increase resolution of the DAC 34. However, to provide optimal calibration, it is necessary to deterine the relative weighting of the second channel relative to the first channel.

The weighting is determined by zeroing the calibrator 10 on the 10 volt range as previously described and then changing the first channel 50 by one increment of duty cycle which changes the output of the calibrator 10 by approximately half a millivolt. The microprocessor 12 then changes the second channel 64 to bring the output back to 0 volts and determines the changing number of increments of duty cycle required to bring the output back to 0 volts. This number of increments of change is the required constant. Another name for the effect of this weighting measurement and compensation is linearization of the DAC 34.

Normally a calibration with the external voltage standard is done only once a month or less frequently. However, it was desired to improve the accuracy of the calibrator 10 on a daily basis so the calibrator 10 is able to perform an internal calibration at any time and once initiated by the operator requires no further operator intervention. The first thing that is performed in the internal calibration is to zero the instrument as previously described and determine the value of the weighting between the two channels. From this new information, new values for $v_{os}$ can be determined for each range and polarity.

The next thing that is detemined is the value of K which is the gain constant which changes when the gain of any of the amplifiers in the calibrator shift due to temperature and time. The primary areas of concern are to measure shifts in the gain of the DAC amplifier 56 or the power amplifier 38.

Referring now to FIG. 5, therein as shown the microprocessor program for determining shift in gain. Essentially, by measuring the shift in gain, it is possible to determine the amount to shift the value of K in order to compensate for this shift in gain. Starting at the gain determination block 170 the program proceeds to the switch feedback resistors and reference polarity block 172. This causes the microprocessor 12 to cause a relay switch (not shown) which is a part of power amplifier 38, to disconnect resistor 88 from power amplifier output 40 and connect it to reference voltage signal lead 30.

The resistors 54 and 62 are the resistors normally used in the DAC 34 to set the gain of the DAC and the resistors 76 and 88 are the resistors normally used to set the gain of the power amplifier on the 10 volt range. The microprocessor then sets the first channel 50 at 100% duty cycle and the second channel 64 at 0%. This effectively connects the reference voltage directly to the input of the amplifier 56 in the DAC 34. As a result, since amplifier 56 is an inverting amplifier and its gain is unity, its output is a negative voltage approximately equal to the reference voltage. By having equal and opposite voltages at the end of the resistor 88 and the resistor 76 and because these resistors are nominally equal in value the voltage at their junction, which is also the input to amplifier 77, is nominally zero volts.

Amplifier 77 is actually made up of two parts, the inputs are connected to a pre-amp which is a low noise, high gain, high stability amplifier which drives a low gain, high current, drive amplifier. The pre-amp, by means of relay switches is configured into a closed loop amplifier of its own with a gain of about 600. This then amplifies the voltage at its input, a voltage designated $v_1$. The output of this amplifier is connected to the A/D converter 46 by means of controlled switch 44. This allows the microprocessor 12 to measure small values of $v_1$ accurately. With the calibrator configured this way, any change in the gain of the DAC or the power amplifier, due to changes in the resistance of resistors 54, 62, 76 and 88, will cause a corresponding change in the value of $v_1$. When the calibrator 10 is calibrated with the external standard, $v_1$ is measured and stored as shown by blocks 174 and 176, respectively in FIG. 5.

The program then checks decision block 178 to determine whether or not the measurement for $v_1$ is complete.

It should be noted that the amplifiers in the DAC 34 and the pre-amp which is part of amplifier 77 have offset voltages which are indeterminate and which change from day to day sufficiently to throw off the readings of $v_1$. Thus, it is necessary that instead of taking just one measurement of $v_1$ that two measurements are taken each time. This is accomplished by having the microprocessor 12 reverse the polarity of the reference voltage 28 and a second reading is taken, designated $v_2$. By taking the difference of the two readings the offset voltage effect is eliminated, but any change in this difference value is still proportional to a shift in gain.

If the measurement is complete, the program proceeds from decision block 178 to the calculate gain shift block 180 where the previous value for $(v_1-v_2)$ stored in memory is compared to the present $(v_1-v_2)$ to determine the shift in gain. Since the shift in voltage is proportional to the shift in gain, the program can proceed to block 182 where a new value for K is calculated.

In order to properly determine the change in gain for the various ranges, it is necessary that the resistance value of resistor 76 be nominally equal to that of resistors 88, 84, 83, and 82. This fact is true for the 10 v range where resistor 76 equals that of resistor 88 but not true for the other ranges where the values of 84, 83 and 82 do not equal the value of resistor 76. For the 22 v range resistor 84 is two resistors in series, one resistor being resistor 88 and the other a resistor of resistor equal value to that of 88. This other resistor is switched in place of resistor 88 in the previously described configuration. Since it is equal to 88 it is also equal to resistor 76 so $(v_1-v_2)$ can be measured as before. The total gain shift for the 22 v range becomes the gain shift determined for the 10 v range (using resistor 88) plus the gain shift determined using this other resistor. On the 275 v and 1100 v ranges resistors 83 and 82 are actually the same ten resistors for both ranges. On the 275 v range they are in a series-parallel configuration and for the 1100 v range are all in series. These values are such that if all ten are put in parallel the total value is nominally equal to that of resistor 76. So this parallel combination is switched in place of resistor 88 in the special configuration and the gain shift determined as before. Whatever percentage gain shift is determined applies for both the 275 v and 1100 v ranges. This makes use of the principle that any group of resistors in parallel, series, or series-parallel where each resistor shares equal power have the same total percentage shift of resistance in any of these configurations. So determining the percentage gain shift with them in parallel holds for when they are in series or series-parallel. From this percentage change, new values of K for each range can be determined.

After the program is done calculating the new values for K the program stores the values in memory in block 184 and then exits via block 186.

As many possible embodiments may be made of the invention without departing from the scope thereof, it is to be understood that all matters set forth herein are shown in the accompanying drawings to be interpreted in an illustrative and not a limiting sense.

I claim:

1. A direct volts calibrator comprising:
   a precision reference source having fixed reference and zero reference potentials;
   a digital to analog converter connected to said source and having a controllable conversion characteristic;
   power amplifier means connected to an output of said digital to analog converter;
   zero amplifier means;
   processor means including means for selectively connecting an input of said zero amplifier means to said zero reference potential and determining a first zero output of said zero amplifier means, means for setting said digital to analog converter to cause the power amplifier to have nominally a zero output and for connecting said input of said zero amplifier means to the output of said power amplifier means to cause the zero amplifier means to develop a second zero output, and means for determining the difference between the first and second zero outputs of said zero amplifier means to develop an offset correction signal.

2. The calibrator as claimed in claim 1 wherein said processor means includes means for applying said offset correction signal to said digital to analog converter to correct said converter by an amount proportional to said difference.

3. A direct volts calibrator comprising:
   a precision reference source having fixed reference and zero reference potentials;
   a digital to analog converter including an input resistor connected to said fixed reference potential, said digital to analog converter including an inverting output amplifier having an inverting input connected to said input resistor and an output, said digital to analog converter including a feedback resistor between the inverting input and the output of said inverting amplifier;
   a power amplifier having an inverting input and an output, and including a primary resistor connected between the inverting input of said power amplifier means and the output of said output inverting amplifier, said power amplifier including a feedback resistor means selectively connectable (1) between the input and output of said power amplifier for controlling the level of amplification of said power amplifier and (2) between the input of said power amplifier and said fixed reference potential;
   an analog to digital converter; and
   processor means connected to said source, said digital to analog converter, said power amplifier means, and said analog to digital converter, said processor means including means for connecting said input resistor of said output amplifier of said converter to said fixed reference and said feedback resistor means of said power amplifier to said fixed reference potential source and obtaining an output measurement of said power amplifier means with said analog to digital converter, reversing the polarity of said source and obtaining a second output measurement of said power amplifier means with said analog to digital converter, determining a first difference between the first and second output measurements and correlating said difference with a predetermined difference representative of an initial gain to determine the change in the composite gain of said power and output amplifiers.

4. The calibrator as claimed in claim 3 wherein said processor means includes means for applying a correction signal to said digital to analog converter whereby the output of said power amplifier means is compensated for said change in gain.

5. A direct volts calibrator comprising:
a precision reference source having fixed reference and zero reference potential outputs;
a digital to analog converter connected to said source, said digital to analog converter including adjustment means for changing a conversion characteristic of the converter and providing adjusted signals;
adjustable gain power amplifier means for amplifying said adjusted signals;
an analog to digital converter;
zero amplifier means having a first input and a second input, and further having an output connected to said analog to digital converter; and
processor means including means for setting said adjustment means to cause the power amplifier means to have nominally a zero output; means for selectively connecting said second input of said zero amplifier means to (1) said first input thereof in a first mode and to (2) the output of said power amplifier means in a second mode; means for making first and second output measurements of said zero amplifier means in said first and second modes, respectively, and means for determining a difference between the first and second output measurements and for processing said difference to develop an offset correction signal.

6. The calibrator as claimed in claim 5 wherein said processor means includes means for applying said offset correction signal to control said digital to analog converter.

7. A direct volts calibrator comprising:
a precision reference source having fixed reference and zero reference potentials;
a digital to analog converter including an input resistor connected to said fixed reference potential, an output amplifier having an inverting input connected to said input resistor and a feedback resistor;
power amplifier means including a power amplifier connected through a primary resistor to the output of said inverting output amplifier, said power amplifier means further including a feedback resistor means consisting of at least two feedback resistors connected in series and together having a predetermined value for controlling the amplification of said power amplifier;
an analog to digital converter; and
processor means connected to said source, said digital to analog converter, said power amplifier means, and said analog to digital converter, said processor means including means for connecting said first feedback resistor to one terminal of said fixed reference potential source, connecting the primary resistor to the output of said inverting amplifier and making a first output measurement of said power amplifier with said analog to digital converter, reversing the polarity of said source and making a second output measurement of said power amplifier with said analog to digital converter, determining a first difference between the first and second power amplifier output measurements and for processing said difference to determine the change in gain of said amplifier for said first feedback resistor, replacing the first feedback resistor with the second feedback resistor and again making the first output measurement of said power amplifier with said analog to digital converter, reversing the polarity of said fixed reference potential and again making the second output measurement of said power amplifier with said analog to digital converter, determining a second difference between said first and second output readings, processing the second difference to determine the change in gain of said amplifier for said second feedback resistor determining the sum of the processed difference, and processing said sum to determine a composite change in gain of said amplifier said feedback resistor means.

8. A direct volts calibrator comprising:
a precision reference source having fixed reference and zero reference potentials;
a digital to analog converter including an input resistor connected to said fixed reference potential and an inverting amplifier having an inverting input connected to said input resistor and a feedback resistor;
power amplifier means including a power amplifier having an input connected through a primary resistor to the output of said inverting amplifier, and a feedback resistor means comprising a plurality of feedback resistors having equal values and together determining the level of amplification of said power amplifier;
an analog to digital converter and;
processor means connected to said source, said digital to analog converter, said power amplifier means, and said analog to digital converter, said processor means including means for connecting the feedback resistors of said feedback resistor means in parallel and to said fixed reference potential and (1) making a first output measurement of said power amplifier with said analog to digital converter, (2) reversing the polarity of said source, (3) making a second output measurement of said power amplifier with said analog to digital converter, (4) determining the difference between the first and second output measurements, and (5) processing said difference measurement to determine a change in gain of said amplifier.

9. In a direct volts calibrator comprising a precision reference source having fixed reference and zero reference potentials, a controllable digital to analog converter responsive to the reference source, and a controllable gain power amplifier driven by the output of the digital to analog converter, and a zero amplifier, a method of zeroing the output of the power amplifier, comprising the steps of obtaining an offset voltage associated with the zero amplifier by applying a zero reference potential to the zero amplifier and making a first output measurement therefrom, connecting the zero amplifier to be responsive to the output of the power amplifier, controlling the digital to analog converter to cause the power amplifier to have a zero output, making a second output measurement from the zero amplifier responsive to the output of the power amplifier, obtaining a difference between the first and second output measurements to develop a zero offset correction signal, and applying the zero offset signal to control said controllable digital to analog converter.

10. In a direct volts calibrator comprising a precision reference source having fixed reference and zero reference potentials, a controllable digital to analog converter responsive to the reference source and a power amplifier driven by the digital to analog converter, the power amplifier including a primary input resistor connected to the output of the converter and a feedback resistor connected in circuit with said power amplifier to control power amplifier gain, a method of measuring gain shift of said power amplifier caused by a change in values of said feedback and primary resistors, comprising the steps of connecting one end of said feedback resistor to the input of said power amplifier and the opposite end of said feedback resistor to said reference source, making a first voltage measurement at the output of said power amplifier; reversing the polarity of said reference source; making a second voltage measurement at the output of said power amplifier; obtaining a difference between said first and second voltage measurements and comparing said difference with a corresponding reference difference to determine a change in gain of said power amplifier.

* * * * *